United States Patent [19]

Keller et al.

[11] Patent Number: 4,920,072
[45] Date of Patent: Apr. 24, 1990

[54] METHOD OF FORMING METAL INTERCONNECTS

[75] Inventors: Stephen A. Keller; Piper A. Spry, both of Sugar Land; Martha S. Adams, Rosenberg; Ralph G. Harper, Guy, all of Tex.

[73] Assignee: Texas Instruments Incorporated, Dallas, Tex.

[21] Appl. No.: 265,157

[22] Filed: Oct. 31, 1988

[51] Int. Cl.⁵ .................................. H01L 21/285
[52] U.S. Cl. ............................ 437/192; 437/194; 437/231; 437/246; 437/190; 357/71; 148/DIG. 26
[58] Field of Search ........... 437/192, 194, 195, 228, 437/187, 189, 245, 246, 231, 190; 357/71; 156/643, 646, 657; 148/DIG. 26, DIG. 50

[56] References Cited

U.S. PATENT DOCUMENTS

| | | | |
|---|---|---|---|
| 4,184,909 | 1/1980 | Chang et al. | 437/190 |
| 4,367,119 | 1/1983 | Logan et al. | 437/195 |
| 4,517,225 | 5/1985 | Broadbent | 437/245 |
| 4,630,357 | 12/1986 | Rogers et al. | 437/189 |
| 4,631,806 | 12/1986 | Poppert et al. | 437/194 |
| 4,666,737 | 5/1987 | Gimpelson et al. | 437/192 |
| 4,670,091 | 6/1987 | Thomas et al. | 156/644 |
| 4,721,689 | 1/1988 | Chaloux, Jr. et al. | 437/189 |
| 4,789,648 | 12/1988 | Chow et al. | 437/245 |
| 4,808,552 | 2/1989 | Anderson | 437/241 |
| 4,824,802 | 4/1989 | Brown et al. | 437/245 |

OTHER PUBLICATIONS

"Phosphosilicate Glass Stabilization of MOS Structures" by Kaplan et al., J. Electrochem. Soc.; Solid State Science, vol. 118, No. 10, pp. 1649–1652.

Primary Examiner—Brian E. Hearn
Assistant Examiner—Tuan Nguyen
Attorney, Agent, or Firm—Carlton H. Hoel; Thomas W. DeMond; Melvin Sharp

[57] ABSTRACT

Metal interconnects and method for forming same such that an intermediately formed aluminum layer provides an etch stop and etch mask during the tungsten etch back. The method may be used to form tungsten contacts without requiring pre-metal planarization of the semiconductor body.

5 Claims, 3 Drawing Sheets

METHOD OF FORMING METAL INTERCONNECTS

BACKGROUND OF THE INVENTION

The present invention relates generally to metal interconnect formation techniques and more particularly relates to the formation of CVD tungsten contacts in a non pre-metal planarized semiconductor body.

Pre-metal planarization of semiconductor bodies prior to metal contact or filled via formation furnishes to easier implementation of photolithography techniques in the subsequent formation of the contacts. However, the planarization process often leads to a non uniform oxide thickness over the silicon substrate. In some instances the oxide is over etched resulting in excessively thin oxide over some areas of the substrate. This is detrimental when, for example, silicides are deposited over the source, drain and gates of a MOS device. If the oxide is too thin the silicide may be etched away increasing the contact resistance. This is an unacceptable condition in that it degrades transistor performance. Additionally pre-metal planarization adds processing steps which resulting in to additional cost considerations.

Prior art solutions such as deposition of spin on glass (SOG) as a planarization technique leads to smoothing of sharp edges but often does not provide adequate planarization of the surface. However SOG is still preferred to pre-metal planarization because it is easier to implement into the process flow and because it leads to an uniform oxide thickness over the contacts.

Thus a method of preventing over etching of the field oxide during etching of the CVD Tungsten contacts without the cost of employing pre-metal planarization is much needed in the semiconductor art.

SUMMARY OF THE INVENTION

In accordance with the teachings of the present invention, the present tungsten contact comprises an oxide layer formed over a semiconductor body; a gettering layer formed over the oxide layer; a spin-on-glass formed over the gettering layer; a barrier metal formed over the spin-on-glass; an aluminum layer formed over the barrier metal; contact openings formed between the surface of the aluminum layer and the surface of the semiconductor body; and tungsten contacts formed in the openings.

BRIEF DESCRIPTION OF THE DRAWING FIGURES

Further features and advantages of the present invention will become apparent from the following and more particular description of the invention, as illustrated in the accompanying drawings, wherein:

FIG. 1-6 are cross sectional views showing various stages in the fabrication of metal contacts according to a preferred embodiment of the invention.

DETAILED DESCRIPTION OF THE PREFERRED EMBODIMENTS

Figure 1:
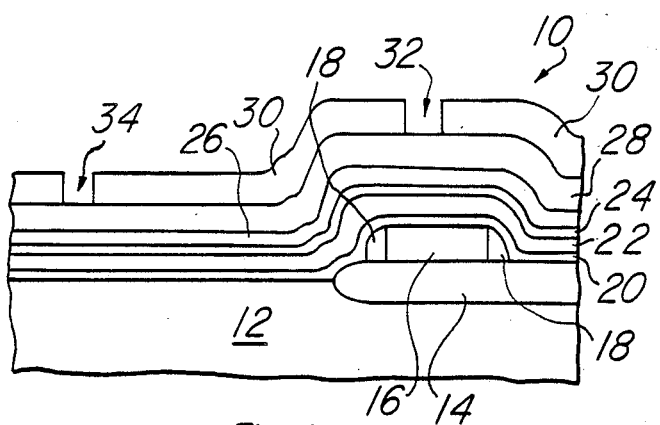

The terms contact and via are used interchangeably herein to describe interconnects. Referring now to drawing FIG. 1, there is shown a semiconductor body 10 having active devices (not shown) formed therein. Semiconductor body 10 comprises a conventional silicon substrate 12 having field oxide isolation regions such as region 14 separating the active devices (not shown). The structure is shown having a CVD oxide layer 20 disposed thereon. Any conventional thin CVD oxide layer may be used, such as TEOS. Deposited on oxide layer 20 is a phosphosilicate glass (PSG) gettering layer 22. A spin-on-glass (SOG) layer 24 is deposited over the PSG layer 22. Next a titanium-tungsten, TiW or other barrier layer material layer 26 is deposited over the spin-on-glass layer 24 to a conventional thickness. Over the TiW layer 26, a layer 28 of aluminum-copper alloy or aluminum is deposited. The aluminum, in accordance with the teachings of the present invention, provides an etch mask in the subsequent formation of contacts. The aluminum layer 28 thickness need not be sufficient for metalization but should be enough to ensure that the tungsten contact plug surface is not etched far beyond the TiW/AlCu interface during the tungsten etch back. In a preferred embodiment, this layer is approximately 200-300 nanometers. Next the contacts or vias are patterned with resist material 30 and exposed, using conventional photoresist/photolithographic techniques, to partially form contact area 32 and 34.

Figure 2:
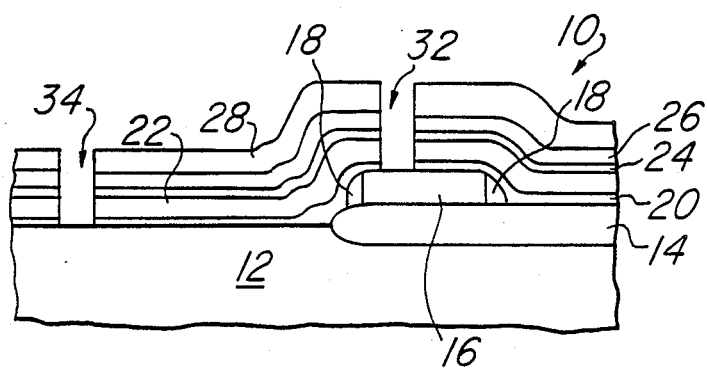

Referring now to FIG. 2, the exposed areas of the surface are shown etched to remove metal layers 26 and 28. In accordance with the teachings of the present invention, the photoresist material may be removed, exposing aluminum layer 28, before further etching of the contact openings. Removal of the photoresist material reduces polymer formation within the oxide etch matchine. However if desired the photoresist material may remain. Next the contacts are etched into the oxide using a high selectivity etch to the underlying single crystal and polycrystalline silicon (polysilicon) to complete formation of the contact openings 32 and 34.

Figure 3:
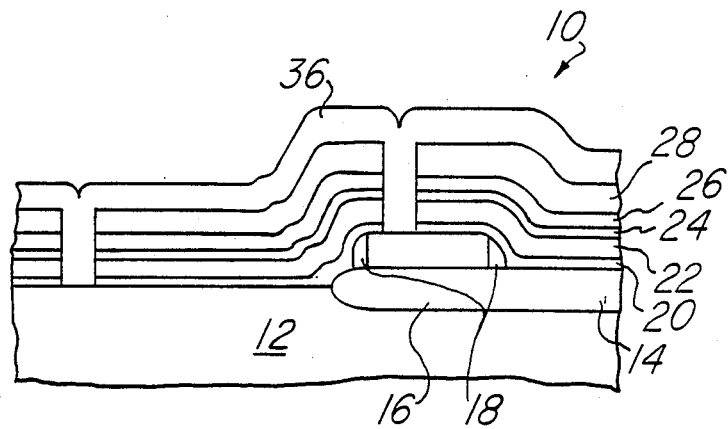
Figure 4:
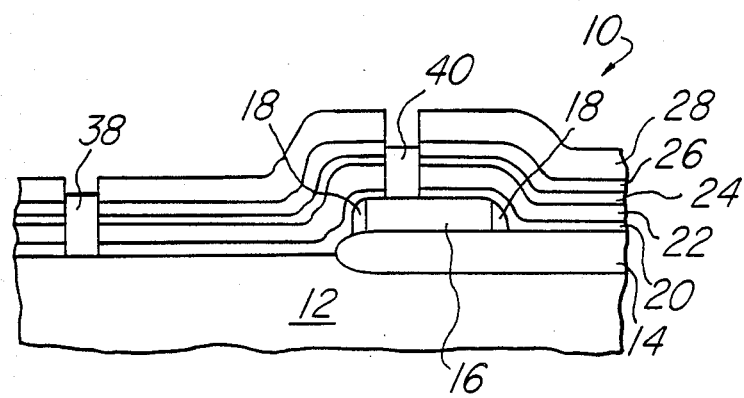

Referring now to FIG. 3, the substrate is shown having a layer of nonselective CVD tungsten 36 disposed thereon. The tungsten layer should be sufficient to fill the contacts or vias. In order to ensure better adhesion of the tungsten within the contact openings, a titanium-tungsten sticky layer (not shown) may be deposited onto the structure. If photoresist 30 has not been previously removed, it should be removed prior to the tungsten deposition. The tungsten layer 36 may now be etched using the aluminum or aluminum-copper material as the etch stop. Preferably the tungsten should be etched until the top of the tungsten plug is level with or near the top surface of the aluminum etch mask material.

Figure 5:
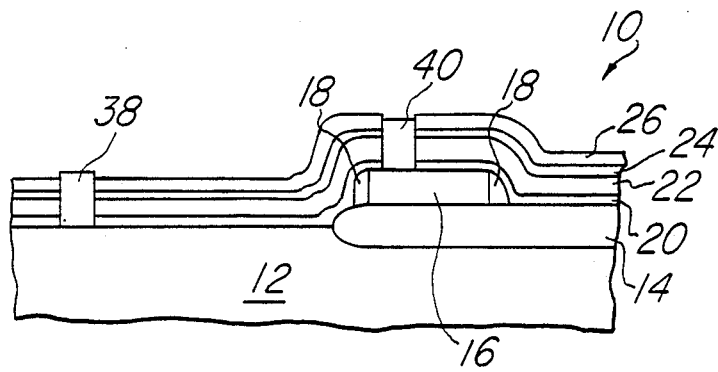
Figure 6:
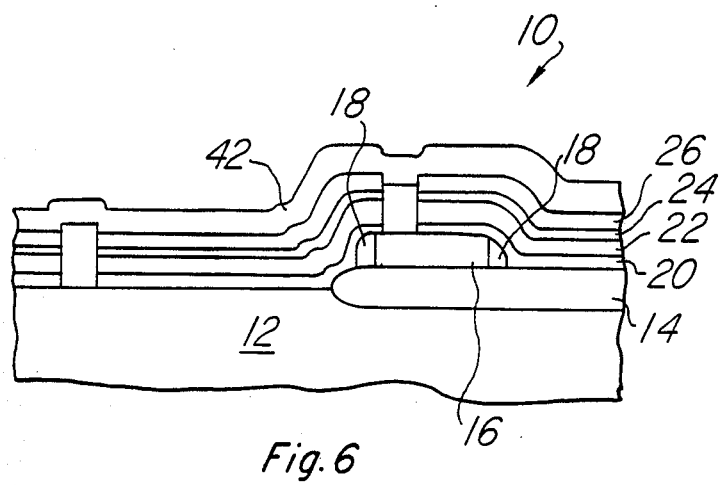

After formation of the contacts 38 and 40, aluminum layer 28 is stripped using an Al leach, Sherman etch or other method that will leave the TiW layer and tungsten plugs intact. The structure processed to this point is shown in FIG. 5. The structure is now ready for deposition of a conventional metalization layer 42 before pre-lead definition. Such metalization layers are usually formed to approximately 700 nanometers. In an alternative embodiment, the additional aluminum required for metalization may be deposited directly onto the etch mask aluminum. This eliminates the process steps required to remove the previously deposited aluminum.

The above described and disclosed process is especially well adapted for integration into processes for the formation of 1.0 micron or less contacts on a metal surface. It should be noted that one of the expected and intended uses of contacts formed in the accordance with the teachings of the present invention is in the interconnection of integrated circuits in an IC product. It is further noted that the teachings of the present invention are compatible with the formation of Bipolar and FET devices and combinations thereof, such as BiMOS and BiCMOS devices.

TECHNICAL ADVANTAGES OF THE INVENTION

From the foregoing a method of forming CVD tungsten contacts on a non pre-metal planarized semiconductor body has been disclosed. A technical advantage of the disclosed process is that during processing, the aluminum will not erode as will conventional photoresist. This has the benefit of a contact profile more vertical than if conventional photoresist is used. Another attendant technical benefit over the use of photoresist is that the photoresist used to pattern the contact regions maybe removed after the metal layers have been etched for the contact openings. This reduces polymer formation in the oxide etch machine.

Another technical advantage of the invention presented is that it facilitates inspection for missing or closing contacts thus allowing better opportunity for reworking the substrate. Additionally, the contacts formed in accordance with the present method have less flaring at the tops thereof.

Yet another technical advantage of the present inventive method is that high selectivity between tungsten/-TiW and oxide is no longer required. Thus tungsten resist etchback is performed without thinning of the CVD oxide layer over the active devices. By using the present method precise measurement of the amount of metal remaining over the CVD oxide after the planarization is not required.

Another technical advantage of the present method is that it eliminates the added processing steps and cost associated with prior art methods which require pre-metal planarization. Yet another technical advantage is that an uniform etch of the tungsten can be obtained without requiring a 1 to 1 selectivity between a photoresist material and the tungsten. The use of SOG instead of pre-metal planarization ensures that all the contacts will have approximately the same etch depth from the surface reducing the contact overetch on shallow contacts. Another technical advantage of the invention is the minimization of over etching of contacts to poly on oxide.

The values and ranges used herein are given for a preferred embodiment of the present invention, of course these values may vary as the parameters are changed. Therefore it is to be understood that many changes in detail may be made as a matter of engineering choices without departing from the spirit and scope of the invention as defined by the appended claims.

What is claimed:

1. A method of forming metal interconnects comprising the steps of:

providing a non planarized semiconductor body having active devices formed thereon;

depositing spin-on-glass on said semiconductor body;

depositing a barrier layer material over said spin-on-glass;

depositing a metal layer over said barrier layer;

forming a photoresist layer over said metal layer and patterning said photoresist for contact formation;

etching said contact pattern into said barrier and metal layers;

removing said photoresist;

further etching said contact pattern to the underlying devices;

depositing a conformal layer of CVD tungsten over said semiconductor body to fill said contact openings;

etching back said tungsten without photoresist using said metal layer as an etch stop to prevent over etching;

stripping said metal layer; and depositing a metalization layer.

2. The method of claim 1 wherein said tungsten contacts are etched to within 100 to 300 nanometers of said barrier layer/metal layer interface.

3. The method of claim 1, wherein said barrier layer material comprises titanium-tungsten.

4. The method of claim 1, wherein said metalization layer comprises aluminum.

5. The method of claim 1, wherein said metal layer is chosen from the group consisting of aluminum, copper, and silicon.

* * * * *